United States Patent [19]
Matsui et al.

[11] Patent Number: 5,930,324
[45] Date of Patent: *Jul. 27, 1999

[54] EXPOSURE APPARATUS AND DEVICE MANUFACTURING METHOD USING THE SAME

[75] Inventors: Shin Matsui, Urawa; Ryuichi Ebinuma, Tokyo; Yuji Chiba; Yutaka Tanaka, both of Utsunomiya, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/831,867

[22] Filed: Apr. 2, 1997

[30] Foreign Application Priority Data

Apr. 3, 1996 [JP] Japan ..................................... 8-104805
Apr. 3, 1996 [JP] Japan ..................................... 8-104806

[51] Int. Cl.$^6$ .................................................. H01L 21/30
[52] U.S. Cl. ............................................. 378/34; 378/206
[58] Field of Search .............................. 378/34, 205, 206, 378/208; 101/450.1; 258/492.1, 492.2, 492.21, 492.22

[56] References Cited

U.S. PATENT DOCUMENTS

| | | | |
|---|---|---|---|
| 5,112,133 | 5/1992 | Kurosawa et al. | 356/401 |
| 5,123,036 | 6/1992 | Uno et al. | 378/34 |
| 5,125,014 | 6/1992 | Watanabe et al. | 378/34 |
| 5,134,640 | 7/1992 | Hirokawa et al. | 378/34 |
| 5,172,402 | 12/1992 | Mizusawa et al. | 378/34 |
| 5,285,488 | 2/1994 | Watanabe et al. | 378/34 |
| 5,317,615 | 5/1994 | Ebinuma et al. | 378/34 |
| 5,347,561 | 9/1994 | Ebinuma | 378/34 |
| 5,377,251 | 12/1994 | Mizusawa et al. | 378/34 |
| 5,398,271 | 3/1995 | Nishida et al. | 378/34 |
| 5,600,698 | 2/1997 | Terashima et al. | 378/34 |

FOREIGN PATENT DOCUMENTS 3-120712  5/1991  Japan .

*Primary Examiner*—David P. Porta
*Attorney, Agent, or Firm*—Fitzpatrick, Cella, Harper & Scinto

[57] ABSTRACT

An exposure apparatus for exposing a wafer to a mask with radiation light to thereby transfer a pattern of the mask onto the wafer, includes a light emitting portion for emitting the radiation light, a stepper major assembly having a wafer stage portion for holding the wafer and being supported by a supporting system separate from the light emitting portion, an alignment measuring portion for alignment measurement for the wafer and the mask and being supported by a supporting system separate from the stepper major assembly, and a correcting system for correcting attitude of the alignment measuring portion with respect to an optical axis of the radiation light.

9 Claims, 10 Drawing Sheets

EXPOSURE APPARATUS AND DEVICE MANUFACTURING METHOD USING THE SAME

FIELD OF THE INVENTION AND RELATED ART

This invention relates to an exposure apparatus for high-precision lithographic printing of a substrate to be exposed, such as a wafer, for example. More particularly, the invention is concerned with an exposure apparatus which may use X-rays. In another aspect, the invention relates to a device manufacturing method using such an exposure apparatus.

The degree of integration of a microdevice such as a semiconductor integrated circuit has increased considerably, and further improvement of printing precision has therefore been required for exposure apparatuses (aligners) for the manufacture of the same.

An example of a proposed ultra-fine pattern printing exposure apparatus is a proximity exposure apparatus using orbit radiation light (SR X-rays). One of the major distinctions of such an SR X-ray exposure apparatus over conventional ultraviolet-ray exposure apparatuses is that a light source device or an X-ray illumination system is supported separately from a positioning stage for positioning a wafer (workpiece to be exposed). Currently, this is inevitable with respect to the disposition of a light source or an X-ray illumination system.

FIG. 10 shows an X-ray exposure apparatus, such as that disclosed in Japanese Laid-Open Patent Application, Laid-Open No. 120712/1991, wherein a light source and a positioning stage are supported separately.

Denoted in FIG. 10 at 100 is an SR light source unit for producing X-rays. It comprises an SR light producing device 102 mounted on a light source table 101. X-rays 104 are emitted from a light emitting point 103. Denoted at 105 is a first mirror having a reflection surface formed into a convex shape, for expanding SR X-rays 104 of a sheet-beam shape elongated in an X (horizontal) direction, and in a Y (vertical) direction. Denoted at 106 is a second mirror for reflecting X-ray flux 107, being diverged by the first mirror 105, so that a central axis of the X-ray flux becomes parallel to the horizontal direction. The X-ray flux as reflected by the second mirror 106 enters an aligner major assembly 109 as exposure illumination light 108.

Denoted at 110 is a mirror chamber for surrounding the first and second mirrors 105 and 106 with a desired vacuum ambience. Denoted at 111 is a first mirror driving means to be used for adjustment of attitude of the first mirror 105, and denoted at 112 is a second mirror driving means to be used for adjustment of attitude of the second mirror 106. Mirror unit 113, including these components, is mounted on a mirror table 114.

Denoted at 115 is a shutter unit for controlling the amount of exposure. It comprises a shutter stay 116, shutter shafts 117 and 118 mounted on the stay 116, and shutter films 119 and 120 stretched between the shafts 117—117 and between the shafts 118—118, respectively. Each of the shutter films 119 and 120 is provided by an endless steel (SUS) belt member with an opening (shutter aperture) 121 or 122 of oblong shape having sides longer than the size of the exposure region.

Denoted at 109 is an aligner major assembly, and denoted at 123 is a mask on which a transfer pattern is formed by an X-ray non-transmissive material such as gold, for example. Denoted at 124 is a mask stage which is movable while carrying the mask 123 thereon. Denoted at 125 is a mask chuck for holding the mask 123 fixed on the mask stage 124. Denoted at 126 is a wafer onto which an image of the mask 123 is to be transferred. Denoted at 127 is a wafer stage which is movable while carrying the wafer 126 thereon. Denoted at 128 is a wafer chuck for holding the wafer 126 fixed on the wafer stage 127. Denoted at 139 is an auto-alignment unit (AA unit) for measuring, with high precision, a positional deviation between the wafer 126 and the mask 123 as held on the mask stage 124. Denoted at 129 is an aligner frame on which the mask stage 124 and the wafer stage 127, for example, are mounted. Denoted at 130 is an aligner base on which the aligner frame 129 is mounted. The aligner base 130 is supported at three locations by means of at least three air springs 131. This air spring means 131 is provided with an air quantity adjusting mechanism 140. Denoted at 132 is a non-contact displacement gauge for detecting positional variation of the aligner base 130 relative to a floor 138. It detects positional variation and feeds it back to the air quantity adjusting mechanism 140. Denoted at 133 is a helium chamber for surrounding the shutter unit 115, the mask 123 on the mask stage 124, and the wafer 126 on the wafer stage 127 with a desired helium ambience. Denoted at 134 and 135 are piping spools for communicating the mirror chamber 110 with the helium chamber 133 while keeping their ambiences. Denoted at 136 is a bellows (B) for flexibly connecting the mirror chamber 110 with the aligner major assembly 109, and denoted at 137 is a beryllium window for transmitting the illumination light 108 and for insulating a vacuum ambience within the mirror chamber 110 and a helium ambience within the helium chamber 133 from each other.

In operation for exposure of the wafer 126 with the structure described above, for every shot, the wafer stage 127 is moved stepwise. By means of the auto-alignment unit 139 and the wafer stage 127, the mask 123 and the wafer 126 are brought into alignment with each other. Plural mask patterns are transferred onto the wafer 126. Since each of the SR light source unit 100, the mirror unit 113 and the aligner major assembly 109 is supported separately from the others, there may occur relative positional variation between them. For example, there may occur a deviation between an optical axis of X-rays coming from the SR light source unit via the mirror unit 113 and a reference attitude of the aligner major assembly 109 (particularly, due to a variation in attitude of the aligner major assembly caused by movement of the stage). With respect to two points, that is, an angular deviation and a deviation along a plane, the aforementioned Japanese Laid-Open Patent Application, Laid-Open No. 120712/1991 proposes the following solutions.

Solution for Angular Deviation

If there occurs an angular deviation between the aligner major assembly 109 and the X-ray optical axis (particularly, when the aligner major assembly 109 shifts), the X-rays are projected on the mask obliquely, and a run-out error results. In consideration thereof, for such an angular deviation between the aligner major assembly 109 and the X-ray optical axis, the non-contact displacement gauge 132 is used to detect the amount of attitude deviation. Through angular attitude control, it is fed back to the air-quantity adjusting mechanism 140 by which the run-out error is prevented.

Solution for Deviation Along Plane (Y direction)

In the X-ray exposure apparatus described above, the X-rays (exposure light) have a uniform intensity (illuminance) in the horizontal direction (X direction). However, with regard to the vertical direction (Y direction), the X-rays have non-uniformness of intensity: that is, the intensity is high at a central portion of the illumination light 108, and it decreases gradually with a distance vertically away from there. In consideration thereof, two blocking plates (shutter films 119 and 120) having shutter apertures 121 and 122, are used and, by controlling movement speeds of them in the Y direction independently of each other, the exposure amount at different portions of the exposure region is controlled. More specifically, in relation to the portions along the Y direction, the time period from a start of transmission of exposure light, responsive to passage of a leading edge of the aperture of the trailing-side blocking plate, to interception of exposure light responsive to passage of a trailing edge of the aperture of the leading-side blocking plate, is controlled, by which proper and uniform exposure of the whole exposure region is attained.

Here, if the aligner major assembly 109 shifts in the Y direction relative to the X-ray optical axis, the preset light intensity distribution is deformed, and a non-uniform exposure amount results.

It may be avoided if the Y-direction deviation is corrected through the angular attitude control described above. However, if there remains a deviation along an exposure plane (Y direction) between the aligner major assembly 109 and the X-ray optical axis, non-uniformness of exposure amount corresponding to the deviation of the aligner major assembly 109 along the plane is calculated on the basis of an X-ray profile (illumination light intensity distribution), having been measured beforehand within the shutter unit 115. Then, the shutter drive curve is controlled to perform shutter correction to avoid exposure non-uniformness.

In the example described above, in connection with the deviation between the X-ray optical axis and the reference attitude of the aligner major assembly 109, particularly, in connection with the attitude (angle) variation of the aligner major assembly attributable to the stage movement, the air quantity adjusting mechanism 140 for the air spring means 131 is used to perform attitude-reproduction drive. However, if the throughput is taken into account, the time of drive required for the attitude-reproduction drive is a non-exposure period. This largely affects the cost per one chip.

While the use of an active damper having linear motor means, for example, in place of air spring means has been proposed in an attempt to reduce the drive time necessary for the attitude-reproduction drive, in that case, the unit itself becomes expensive.

SUMMARY OF THE INVENTION

It is an object of the present invention to provide an exposure apparatus by which substantially the same advantages are held in relation to a change in attitude as described above and also by which the cost of the apparatus as well as the cost of the chip can be made lower.

It is another object of the present invention to provide an exposure apparatus by which no run-out error occurs if a deviation is produced on the optical-axis side.

In accordance with an aspect of the present invention, there is provided an exposure apparatus for exposing a wafer to a mask with radiation light to thereby transfer a pattern of the mask onto the wafer, said apparatus comprising: a light emitting portion for emitting the radiation light; a stepper major assembly having a wafer stage portion for holding the wafer, wherein said light emitting portion and said stepper major assembly are held by separate supporting systems; an alignment measuring portion for alignment of the wafer and the mask, being supported by a supporting system separate from that for said stepper major assembly; and correcting means for correcting attitude of said alignment measuring portion with respect to an optical axis of the radiation light.

More specifically, in the present invention, the auto-alignment unit (alignment measuring portion) which is incorporated into the aligner unit (stepper major assembly) in the conventional example may be mounted on a supporting system separate from an aligner base for supporting the aligner unit, and a change in attitude of the aligner major assembly due to movement of the wafer stage may be measured, as a positional deviation between the mask and the auto-alignment unit, by use of measuring means included in the auto-alignment unit for alignment of the mask and the wafer. A positional deviation signal may be fed back to an angle adjusting mechanism for the mask stage. Also, in order to prevent positional deviation between the mask and the wafer due to drive of the mask stage angle adjusting mechanism, the same drive amount may be applied to an angle adjusting mechanism for the wafer stage.

Similarly, the auto-alignment unit may be mounted on a supporting system separate from the aligner base, and a mask unit including the mask may be held fixed on the auto-alignment unit (providing a supporting system separate from the aligner base). A change in attitude of the aligner major assembly due to stage movement may be measured, as a positional deviation between the mask and the wafer, by use of measuring means included in the auto-alignment unit, for alignment of the mask and the wafer. A positional deviation signal may be fed back to an angle adjusting mechanism for the wafer stage.

Further, the auto-alignment unit may be provided with an auto-alignment angle adjusting mechanism which is movable to define an angle with respect to a plane perpendicular to the exposure optical axis. Also, an SR optical axis monitor may be added to measure a deviation of the optical axis with respect to the auto-alignment optical axis (optical axis of the auto-alignment unit), at a desired timing.

In accordance with the present invention, the alignment measuring portion may be supported by a supporting system separate from the stepper major assembly. As a result, if there occurs a variation in attitude of the aligner major assembly due to movement of the wafer stage, it does not cause a deviation between the optical axis and the auto-alignment optical axis and, therefore, no run-out error results. In place, there occurs a deviation in the interrelation between the auto-alignment unit and the aligner major assembly. However, such a deviation may be measured as a positional deviation between the mask and the auto-alignment unit. A positional deviation signal may be fed back to the angle adjusting mechanism for the mask and/or the wafer. Thus, without retrieval of a attitude change of the aligner major assembly through air damper means, the attitude change may be corrected through the angle adjusting mechanism for the mask and/or the wafer, by which the pattern transfer process with the same registration precision as there occurs no attitude change, is assured.

It will be readily understood that, since the the angle adjusting mechanism for the mask and/or the wafer has a good responsiveness, the correction time is sufficiently faster than the attitude correction time with the air spring means. Further, substantially the same advantages can be held with a lower cost, than a case when an active damper is used.

Further, even if a deviation occurs on the X-ray optical axis side, it may be detected by an optical axis monitor which serves to measure a deviation of the optical axis to the auto-alignment unit (optical axis) at a desired timing. By correcting it with the use of an auto-alignment angle adjusting mechanism of the auto-alignment unit, the occurrence of run-out error is prevented and high-precision registration exposure is assured.

In accordance with another aspect of the present invention, there is provided an exposure apparatus for exposing a wafer to a mask with radiation light to thereby transfer a pattern of the mask onto the wafer, said apparatus comprising: a light emitting portion for emitting the radiation light; a stepper major assembly having a wafer stage portion for holding the wafer; wherein said light emitting portion and said stepper major assembly are held by separate supporting systems; and wherein an alignment measuring portion for alignment of the wafer and the mask, position measuring means for the wafer stage portion, and the mask are supported by a supporting system separate from that for said stepper major assembly. Namely, in this aspect of the present invention, an auto-alignment unit, a mask chuck portion including a mask and position measuring means for the wafer stage positioning, which are incorporated into the aligner unit (aligner major assembly) in the conventional example, are mounted on a supporting system separate from the aligner base.

Preferably, the auto-alignment unit, the mask chuck portion and the positioning means for the wafer stage positioning may be held by one and the same supporting system, integrally.

The radiation light to be projected in an exposure apparatus according to the present invention may be anyone which is usually employed for wafer exposure. Particularly, the exposure apparatus of the present invention is suitable for X-ray exposure using synchrotron radiation light.

The auto-alignment unit may be provided with an auto-alignment stage which is movable along two orthogonal axes on a plane perpendicular to the optical axis and also movable along a rotational direction about the optical axis, and an auto-alignment angle adjusting mechanism which is movable along rotational directions about two axes on a plane perpendicular to the optical axis. An SR optical axis monitor may be added to measure relative deviation between the optical axis and the auto-alignment optical axis, at a desired timing. The auto-alignment unit, the mask chuck portion and the position measuring means for wafer stage positioning may be held integrally with each other, and they move integrally during the auto-alignment stage motion and auto-alignment angle adjustment.

With the structure described above, since there are separate supporting systems for the optical axis and the auto-alignment optical axis, a change in attitude of the aligner major assembly due to wafer stage movement does not cause a change in attitude and, thus, it does not produce a run-out error. Further, since the position measuring means for the wafer stage positioning is structured with a supporting system separate from the aligner major assembly, even if a change of attitude occurs in the aligner major assembly, the amount of change can be measured by the positioning means for the wafer stage positioning at a desired timing, and it can be fed back to the wafer stage.

It will be readily understood that, because of good responsiveness, the correction time for the wafer stage is sufficiently faster than the attitude correction time with the air spring means. Further, substantially the same advantages can be held with a lower cost, than a case when an active damper is used.

Thus, even if the attitude of the aligner major assembly changes, it does not affect the positional relationship between the optical axis and the auto-alignment optical axis. Also, it has substantially no influence upon the positional relationship among them and the wafer.

Further, even if a deviation occurs on the optical axis side, it may be detected by an SR monitor which serves to measure a deviation of the optical axis to the auto-alignment unit (optical axis) at a desired timing. By correcting it with the use of an auto-alignment angle adjusting mechanism or an auto-alignment stage of the auto-alignment unit, an occurrence of run-out error is prevented and high-precision registration exposure is assured. As regards the relation among the mask, the wafer and the auto-alignment unit in connection with the correction drive by the auto-alignment unit, since the auto-alignment unit, the mask chuck portion and the position measuring means for the wafer stage positioning are held integrally, the positional relation among them is unchanged. In other words, since the position measuring means for wafer stage positioning is set with reference to the optical axis, any deviation on the optical axis side does not cause a shift of the relation with the wafer stage.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
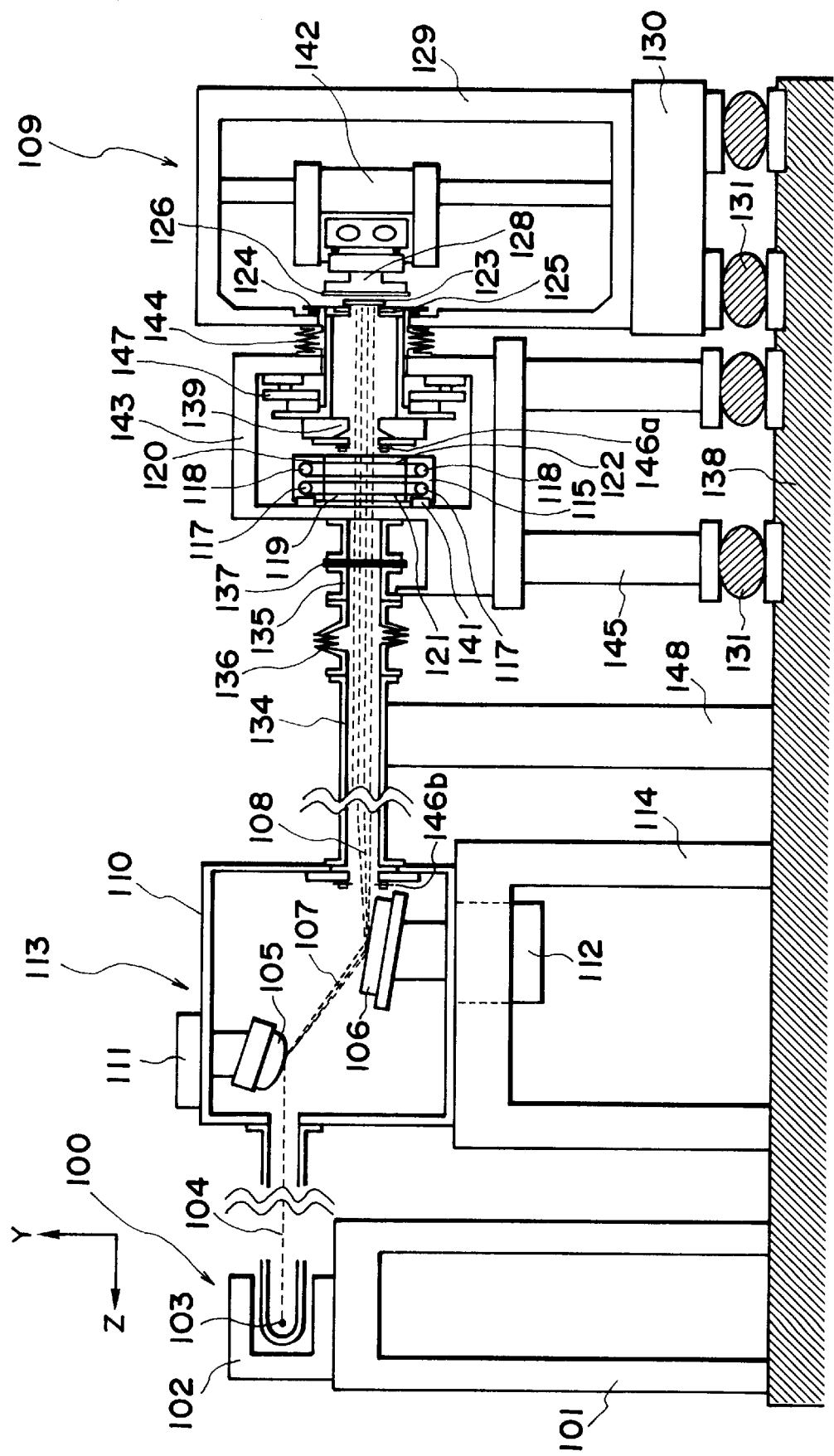
FIG. 1 is a schematic view of an X-ray aligner according to an embodiment of the present invention.

FIG. 1 shows an X-ray aligner according to an embodiment of the present invention. Denoted in FIG. 1 at 100 is an SR light source unit for producing X-rays. It comprises an SR light producing device 102 mounted on a light source table 101. X-rays 104 are emitted from a light emitting point 103.

Denoted at 105 is a first mirror having a reflection surface formed into a convex shape, for expanding SR X-rays 104 of a sheet-beam shape elongated in the X (horizontal) direction, and in the Y (vertical) direction. Denoted at 106 is a second mirror for reflecting X-ray flux 107, being diverged by the first mirror 105, so that a central axis of the X-ray flux becomes parallel to the horizontal direction. The X-ray flux as reflected by the second mirror 106 enters an aligner major assembly 109 as exposure illumination light 108.

Denoted at 110 is a mirror chamber for surrounding the first and second mirrors 105 and 106 with a desired vacuum ambience. Denoted at 111 is a first mirror driving means to be used for adjustment of attitude of the first mirror 105, and denoted at 112 is a second mirror driving means to be used for adjustment of attitude of the second mirror 106. Mirror unit 113, including these components, is mounted on a mirror table 114.

Denoted at 115 is a shutter unit for controlling the amount of exposure. It comprises shutter shafts 117 and 118 mounted on a shutter holding table 141, and shutter films 119 and 120 stretched between the shafts 117—117 and between the shafts 118—118, respectively. Each of the shutter films 119 and 120 is provided by an endless steel (SUS) belt member with an opening (shutter aperture) 121 or 122 of oblong shape having sides longer than the size of the exposure region.

Mounted on an auto-alignment table 145 is an auto-alignment frame 143 on which the shutter unit 115 and an auto-alignment unit 139, for example, are mounted. This auto-alignment table 145 is communicated with an aligner major assembly 109 through a bellows (A) 144, flexibly connecting it to the aligner major assembly 109. Thus, a chamber structure is provided by which the shutter unit 115, the auto-alignment unit 139, a mask 123 on a mask stage 124, and a wafer 126 on a wafer six-axis stage 142 can be surrounded by a desired helium ambience. Of course, it is so arranged that, even if the chamber inside is held at a reduced pressure, the bellows (A) 144 between the aligner major assembly 109 and the auto-alignment frame 143 is not contracted.

Denoted at 134 and 135 are piping spools for communicating the mirror chamber 110 with the auto-alignment frame 143 as well as the aligner major assembly 109 while keeping their ambiences. Denoted at 136 is a bellows (B) for flexibly connecting the mirror chamber 110 with the auto-alignment frame 143, and denoted at 137 is a beryllium window for transmitting the illumination light 108 and for insulating vacuum ambience within the mirror chamber 110 and helium ambiences within the auto-alignment frame 143 and the aligner major assembly 109, from each other. It is supported by a beam-line fixing table 148.

Denoted at 109 is the aligner major assembly, and denoted at 123 is the mask on which a transfer pattern is formed by an X-ray non-transmissive material such as gold, for example. Denoted at 124 is the mask stage which is movable in a tilt direction with respect to the exposure optical axis, while carrying the mask 123 thereon.

Denoted at 125 is a mask chuck for holding the mask 123 fixed on the mask stage 124. Denoted at 126 is a wafer onto which an image of the mask 123 is to be transferred. Denoted at 142 is a wafer six-axis stage which is movable while carrying the wafer 126 thereon. Denoted at 128 is a wafer chuck for holding the wafer 126 fixed on the wafer stage 142. Denoted at 139 is an auto-alignment unit (AA unit) fixedly mounted on the auto-alignment frame 143 and placed on an auto-alignment tilt stage 147 which is movable in a tilt direction with respect to the exposure optical axis. It serves to measure, with high precision, a positional deviation of the mask 123 with respect to the auto-alignment unit 139 and a positional deviation of the wafer 126 with respect to the mask 123.

Denoted at 146a and 146b are SR optical axis monitors for monitoring a deviation of an exposure optical axis of the illumination light 108. The SR optical axis monitors serve to monitor the position of the SR light, at least at two separate points on the exposure optical axis, to thereby detect the position and the angle of the SR optical axis. For monitoring the position of the SR light at respective points, as an example, two or more SR light intensity sensors may be disposed to sandwich the SR light therebetween, and outputs of these sensors may be compared with each other. Using two SR light intensity sensors enables detection of the position of the SR light in terms of one-dimensional information. Using three or more SR light intensity sensors enables complete detection of the position of SR light in terms of two-dimensional information.

Denoted at 146a is one sensor group in an example where the SR optical axis is monitored at two points. It is fixed to the auto-alignment unit 139. The other sensor group 146b is fixed to the mirror chamber 110, at a portion just after diversion by the first mirror 106. By measuring the intensity profile by means of these two sensor groups, any deviation of the SR optical axis from a predetermined position (in X, Y and tilt directions) can be monitored.

Denoted at 129 is an aligner frame on which the mask stage 124 and the wafer six-axis stage 142, for example, are mounted. It is communicated with the auto-alignment frame 143 to provide a chamber structure by which a desired ambience is retained.

Denoted at 130 is an aligner base on which the aligner frame 129 is mounted. The aligner base 130 is supported at three locations by means of at least three air springs 131.

In operation for exposure of the wafer 126 with the structure described above, for every shot, the wafer six-axis stage 142 is moved stepwise. By means of the auto-alignment unit 139 and the wafer stage 142, the mask 123 and the wafer 126 are brought into alignment with each other. Plural mask patterns are transferred onto the wafer 126. The SR light source unit 100, the mirror unit 113 and the aligner major assembly 109 are all formed into separate supporting systems, as described. With regard to a relative positional variation among them, that is, with regard to a deviation between the aligner major assembly and the optical axis of the X-rays coming from the SR light source unit 100 via the mirror unit 113, the following solution is provided.

Figure 2:
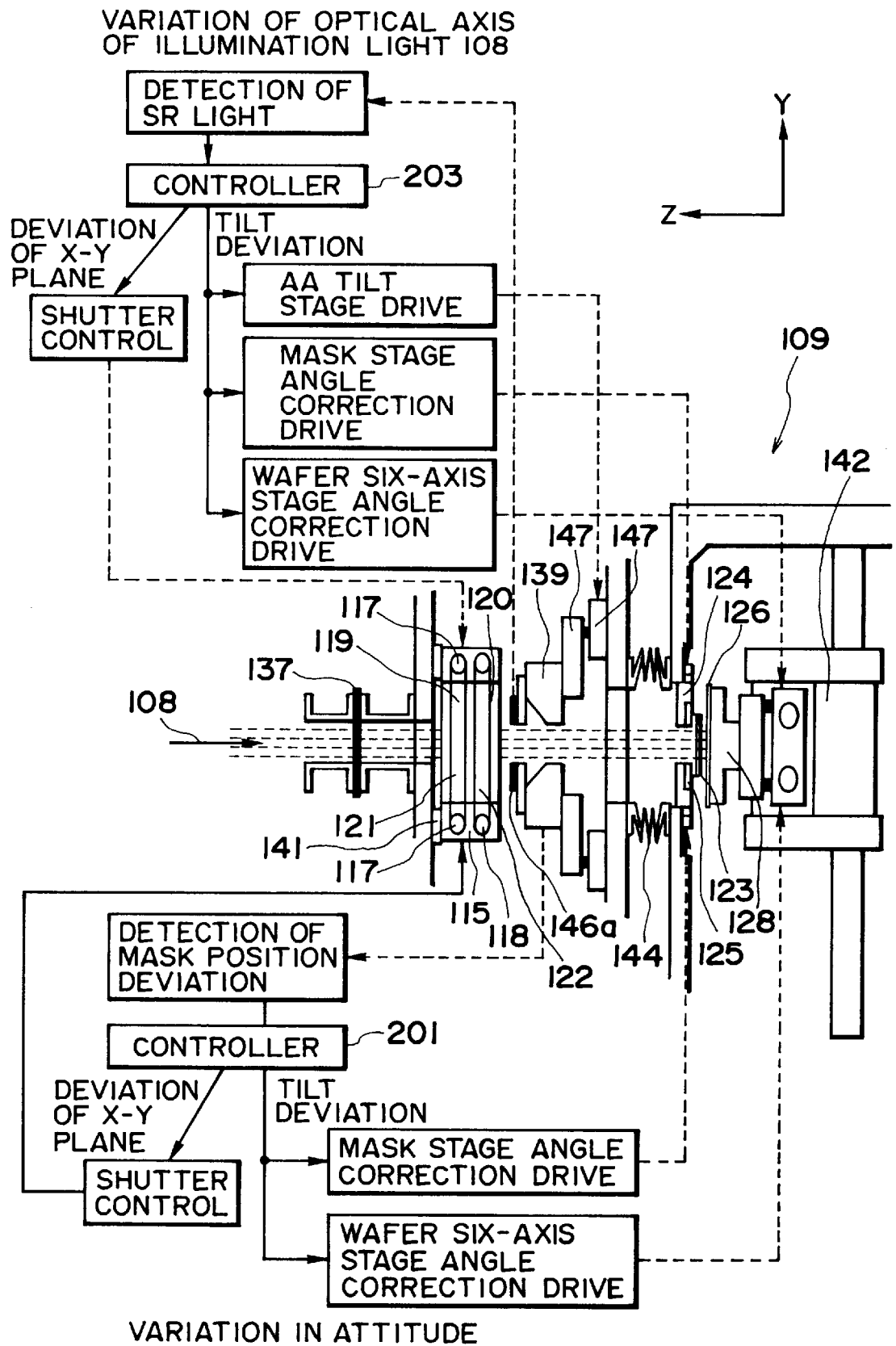
FIG. 2 is a schematic and diagrammatic view, partially in enlargement of a portion of FIG. 1, for explaining a process of correction of a change in relative position between an X-ray optical axis (illumination light 108) and an aligner major assembly 109.

FIG. 2 is an enlarged view of a portion of FIG. 1, and it illustrates how to correct a relative positional displacement between the X-ray optical axis (illumination light 108) and the aligner major assembly 109.

First, because the auto-alignment unit 139 is structured with a supporting system separate from the aligner major assembly 109, a variation appears as a deviation of the mask 123 relative to the auto-alignment unit 139. This deviation is measured by the auto-alignment unit 139 (detection of mask positional deviation), and an angular deviation component of a corresponding positional deviation signal is fed back to an angle adjusting mechanism of the mask stage 124. Also, in order that the drive of the angle adjusting mechanism of the mask stage 124 does not produce positional deviation between the mask 123 and the wafer 126, the same drive amount is applied to an angle adjusting mechanism of the wafer six-axis stage 127.

Then, when attitude (angle) deviation occurs in the SR light source unit or at the X-ray optical axis side of the mirror unit 113 (displacement of the optical axis of illumination light 108), relative to the aligner major assembly, correction is made as follows. That is, deviation of the SR optical axis is detected by means of the SR optical axis monitors 146a and 146b of the mirror chamber and the auto-alignment unit 139, and the auto-alignment tilt stage 147 is driven under the control of a controller 203 and in accordance with the detected amount of tilt, by which the attitude of the auto-alignment unit 139 is adjusted with respect to the shifted X-ray optical axis (illumination light 108). Also, in order that this correction procedure does not cause a shift of the interrelation among the auto-alignment unit 139, the mask 123 and the wafer 126, the same drive amount is applied to the angle adjusting mechanisms for the mask and the wafer, respectively.

With the drives described above, the deviation in the tilt direction among the exposure optical axis, the mask 123 and the wafer 126 can be corrected. Since, however, the attitude variation of the aligner major assembly 109 (particularly, attitude variation due to movement of the stage) comprises essentially a change with respect to the aligner base 130, there still remains a difference with the rotational axis of the angle adjusting mechanism of the wafer six-axis stage 142, as a deviation in the X and Y directions.

Further, when there occurs a deviation in the SR light source unit 100 or on the X-ray optical axis (illumination light 108) side of the mirror unit 113, for example, relative to the aligner major assembly (i.e., a shift of the optical axis of the illumination light 108), similarly there remains a difference with the rotational axis of the angle adjusting mechanism of the auto-alignment tilt stage 147 as a deviation in the X and Y directions.

With regard to this deviation along the X-Y plane, similar to the conventional procedure, the deviation in the X and Y directions is taken into account with respect to the X-ray intensity profile (intensity distribution of illumination light) measured beforehand and, by changing the shutter drive curve so as not to produce exposure non-uniformness, the opening time period of the shutter apertures 121 and 122 is controlled. Thus, a deviation in the X and Y directions from a preset exposure position does not cause an increase of exposure non-uniformness.

Figure 3:
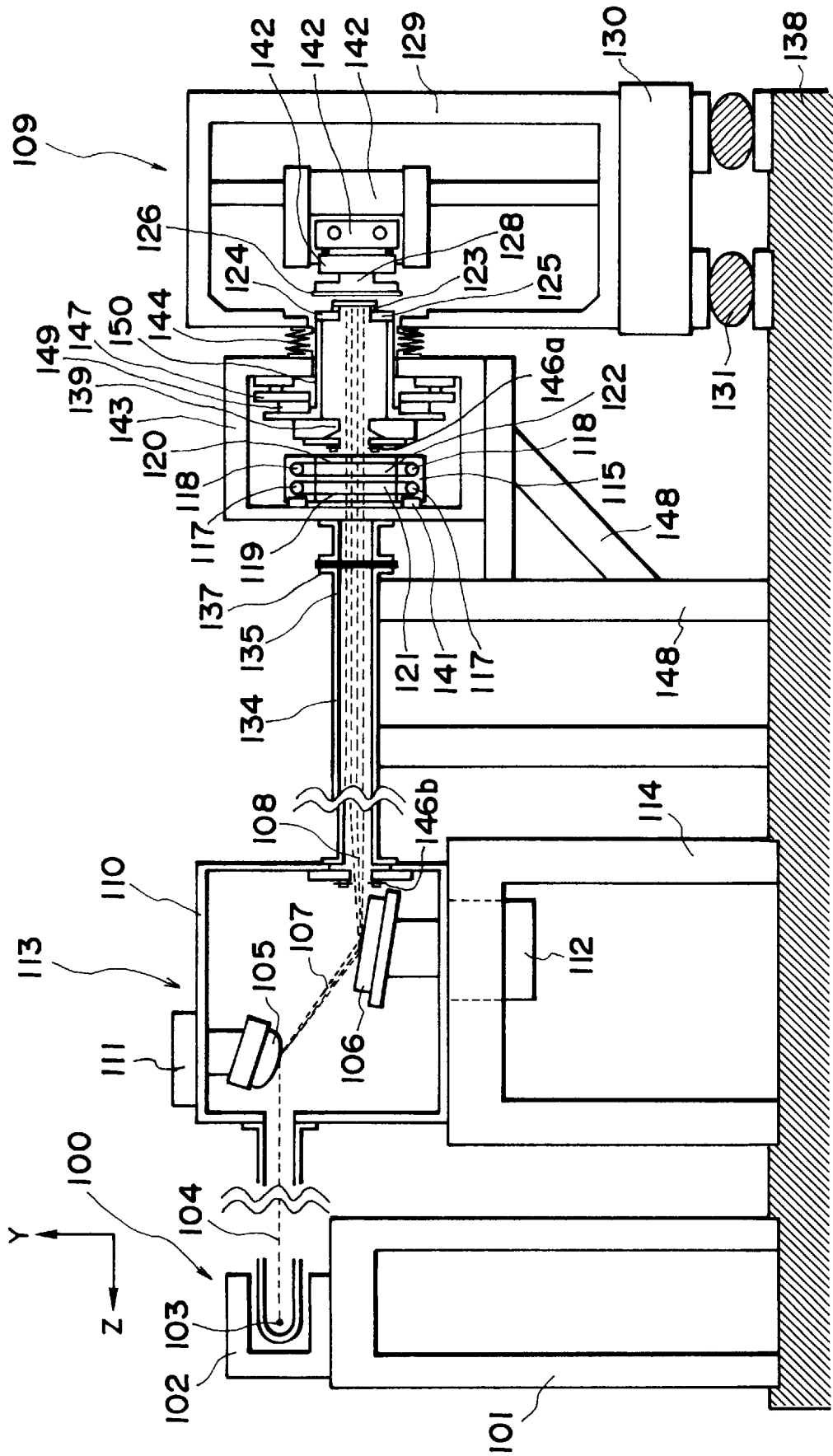
FIG. 3 is a schematic view of an X-ray aligner according to another embodiment of the present invention.

FIG. 3 shows an X-ray aligner according to another embodiment of the present invention. Here, a description for those components of SR light source unit 100 and of mirror unit 113, for example, of FIG. 3 similar to those of FIG. 1 will be omitted. Denoted at 148 is a beam-line fixing table. Mounted on this table is a piping spool 134 for connecting the mirror chamber 110, the auto-alignment frame 143 and the aligner major assembly 109 while keeping their ambiences. Also mounted on the table 148 is a beryllium window 137 for transmitting the illumination light 108 and for insulating the vacuum ambience within the mirror chamber 110 and the helium ambience within the aligner major assembly 109 and the auto-alignment frame 143, from each other. Further, the auto-alignment frame 143 which accommodates therein the auto-alignment unit 139 and the shutter unit 115, for example, is mounted on the table 148.

The auto-alignment unit 139 is provided with an auto-alignment tilt stage 147 for adjustment of the angle thereof. Additionally, it is provided with an auto-alignment X-Y stage 149 for correction drive in the X and Y directions. Thus, it has freedom along the X-Y plane. Denoted at 150 is a mask fixing portion, being protruded to the mask 123 side from the auto-alignment unit 139, for holding fixedly and integrally the mask 123 and the mask chuck 125 to the auto-alignment unit 139. With this structure, the mask 123 can be supported on the beam-line fixing table 148.

With the arrangement described above, similar to the apparatus of the FIG. 1 embodiment, the following solution is provided in relation to relative deviation between the X-ray optical axis from the SR light source unit 100 via the mirror unit 113 and the reference attitude of the aligner major assembly 109.

Figure 4:
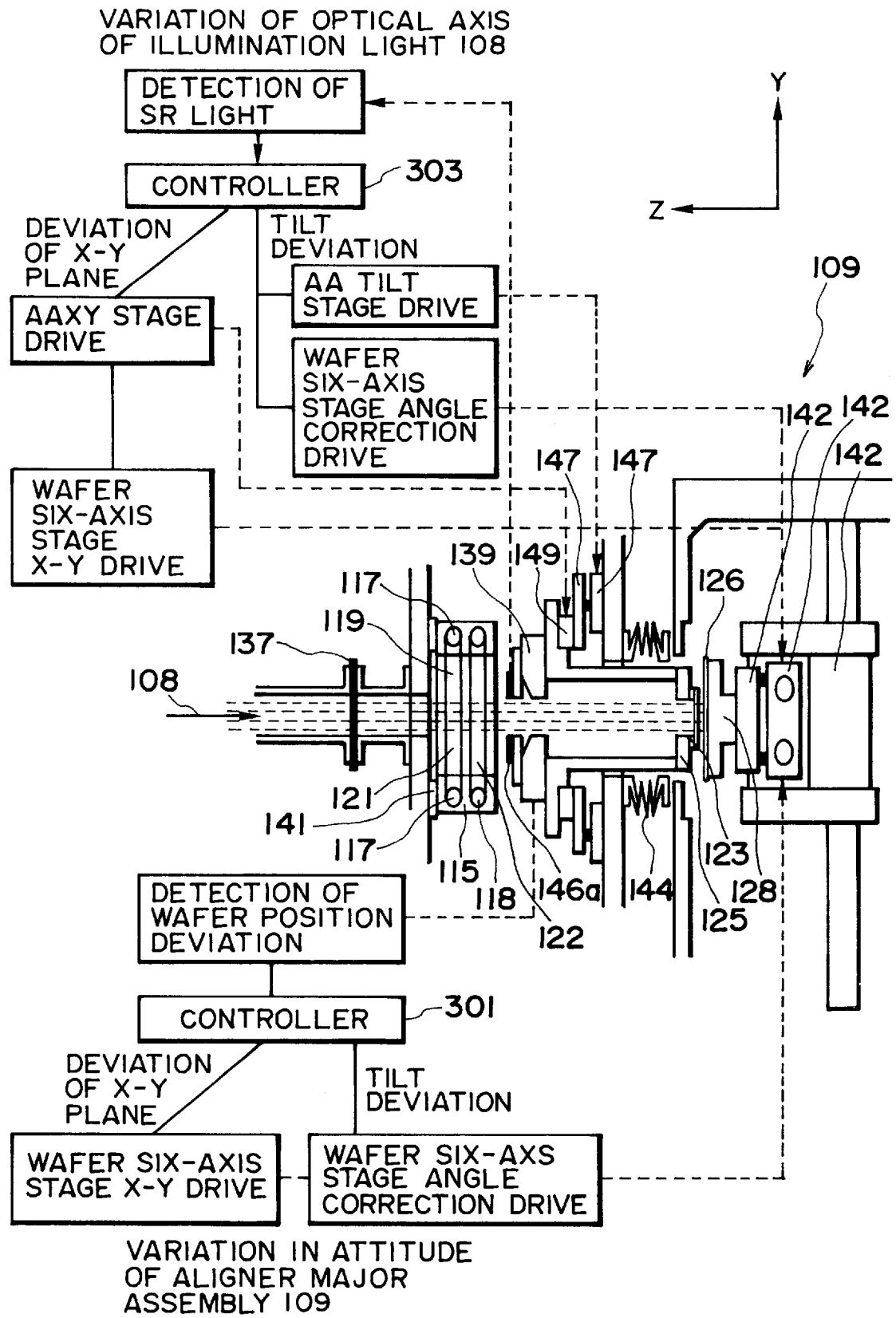
FIG. 4 is a schematic and diagrammatic view, partially in enlargement of a portion of FIG. 3, for explaining a process of correction of a change in relative position between an X-ray optical axis (illumination light 108) and an aligner major assembly 109.

FIG. 4 is an enlarged view of a portion of FIG. 3, and it illustrates how to correct relative positional variation between the X-ray optical axis (illumination light 108) and the aligner major assembly 109.

First, an attitude (angle) variation of the aligner major assembly (particularly, one attributable to the stage movement) appears as a deviation of the wafer 126 relative to the mask 123. This is because each of the auto-alignment unit 139 and the mask 123 is structured with a supporting system separate from the aligner major assembly 109, such that not only the auto-alignment unit 139, but also the mask 123 are not influenced by the attitude change of the aligner major assembly 109.

This deviation (wafer positional deviation) is measured by the auto-alignment unit 139, and an angular deviation component of a corresponding positional deviation signal is fed back to an angle adjusting mechanism of the wafer six-axis stage 142 through a controller 301. Namely, the deviation is treated as an X-Y deviation in normal wafer positioning operation, and alignment procedure of the mask 123 and the wafer 126 is performed.

Then, when attitude (angle) deviation occurs in the SR light source unit or at the X-ray optical axis (illumination light 108) side of the mirror unit 113 (i.e., displacement of the optical axis of illumination light 108), relative to the aligner major assembly 109, correction is made as follows. That is, deviation of the SR optical axis is detected by means of the SR optical axis monitors 146a and 146b provided in association with the mirror chamber 110 and the auto-alignment unit 139 (detection of SR light deviation), and the auto-alignment tilt stage 147, by which the mask 123 as well is fixedly held, is driven under the control of a controller 303 and in accordance with the detected amount of tilt. By this, the auto-alignment unit 139 is adjusted with respect to the shifted X-ray optical axis (illumination light 108). Also, in order that this correction drive does not cause a shift of the interrelation among the auto-alignment unit 139, the mask 123 and the wafer 126, the same drive amount is applied to the angle adjusting mechanism for the wafer, and the angle of the wafer six-axis stage 142 is adjusted.

With the drives described above, the deviation in the tilt direction among the exposure optical axis, the mask 123 and the wafer 126 can be corrected. Since, however, the attitude variation of the aligner major assembly 109 (particularly, attitude variation due to movement of the stage) comprises essentially a change with respect to the aligner base 130, there still remains a difference with the rotational axis of the angle adjusting mechanism of the wafer stage 142, as a deviation in the X and Y directions.

With regard to such a deviation, since the auto-alignment unit 139 and the mask 123 are held fixed to the beam-line fixing table 148 and the relation among the X-ray optical axis, the auto-alignment unit 139 and the mask 123 is unchanged, the wafer six-axis stage 142 may be driven in the X and Y directions through the controller 301 to perform the mask and wafer alignment operation for X-Y deviation as in an ordinary wafer positioning operation.

Further, when there occurs a deviation in the SR light source unit 100 or on the X-ray optical axis (illumination light 108) side of the mirror unit 113, for example, relative to the aligner major assembly 109, similarly there remains a difference with the rotational axis of the angle adjusting mechanism of the auto-alignment tilt stage 147 as a deviation in the X and Y directions.

With regard to such a deviation in the X and Y directions, in the FIG. 1 embodiment, the exposure amount control is performed within the shutter unit 115. However, in the present embodiment, since the auto-alignment unit is provided with an auto-alignment X-Y stage 149, it is corrected by means of the auto-alignment X-Y stage 149 through the controller 303. Although the above-described correction causes a change in the positional relationship among the auto-alignment unit 139, the mask 123 and the wafer 126, since, in relation to this deviation, the interrelation between the auto-alignment unit 139 and the mask 123 is unchanged, the wafer six-axis stage 142 may be driven in the X and Y directions in accordance with the amount of drive of the auto-alignment X-Y stage 149, such that the mask and wafer alignment operation may be done for X-Y deviation as in an ordinary wafer positioning procedure.

In accordance with the second embodiment as described above, since the mask is held fixed to the auto-alignment unit, the mask positioning operation is unnecessary and, therefore, the mask stage can be omitted. Further, with the addition of the auto-alignment X-Y stage, control of the exposure amount through the shutter unit can be simplified.

In accordance with the embodiments described above, an alignment measuring portion and a stepper major assembly are supported by separate supporting systems. Also, correcting means is provided to correct the attitude of the alignment measuring portion so as to keep the attitude of the alignment measuring means with respect to the optical axis of the exposure light. As a result, even if there occurs a shift of attitude of the stepper major assembly due to movement of a wafer stage, the attitude of the alignment measuring portion with respect to the exposure light is unchanged. Thus, only by adjustment of the wafer, by angular adjustment of the wafer and the mask, by drive adjustment of the shutter, or by ordinary X-Y alignment of the wafer, for example, the effect of attitude change can be corrected. Further, even if the optical axis of the exposure light tilts, with the correction of the attitude of the alignment measuring portion through the correcting means and with the angular adjustment of only the wafer or of the wafer and the mask, with the drive adjustment of the shutter or with ordinary X-Y alignment of the wafer, for example, the effect of attitude change of the exposure light source can be corrected. Therefore, it is unnecessary to control the attitude of the stepper major assembly as a whole, including the alignment measuring portion. Thus, improvement of throughput and reduction of cost of the apparatus are enabled.

Figure 5:
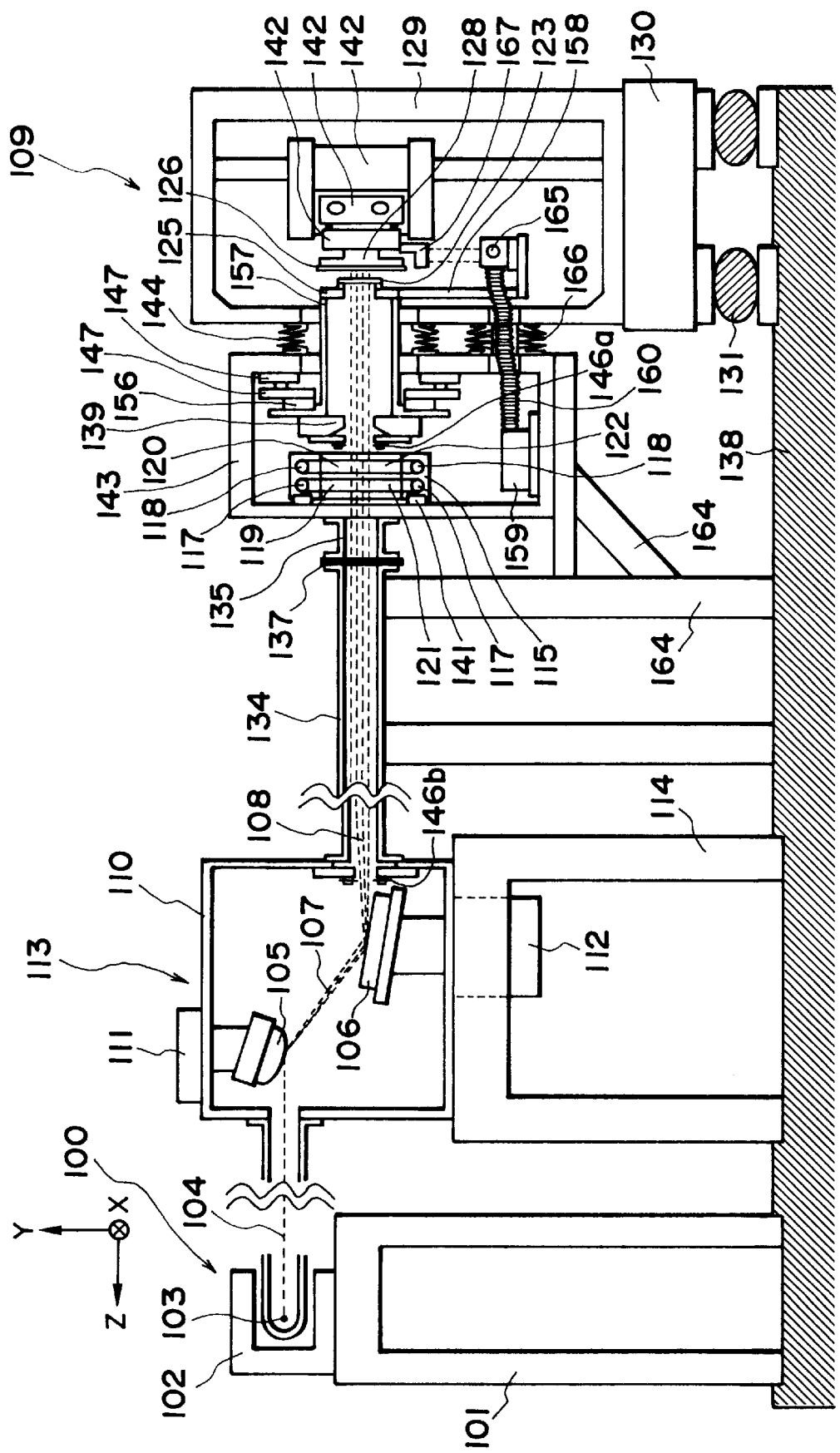
FIG. 5 is a schematic view of an X-ray aligner according to a further embodiment of the present invention.

FIG. 5 shows an X-ray aligner according to a further embodiment of the present invention. Like numerals as those of the foregoing embodiments are assigned to corresponding elements. Denoted in FIG. 5 at 100 is an SR light source unit for producing X-rays. It comprises an SR light producing device 102 mounted on a light source table 101. X-rays 104 are emitted from a light emitting point 103.

Denoted at 105 is a first mirror having a reflection surface formed into a convex shape, for expanding SR X-rays 104 of a sheet-beam shape elongated in the X (horizontal) direction, and in the Y (vertical) direction. Denoted at 106 is a second mirror for reflecting X-ray flux 107, being diverged by the first mirror 105, so that a central axis of the X-ray flux becomes parallel to the horizontal direction. The X-ray flux as reflected by the second mirror 106 enters an aligner major assembly 109 as exposure illumination light 108.

Denoted at 110 is a mirror chamber for surrounding the first and second mirrors 105 and 106 with a desired vacuum ambience. Denoted at 111 is a first mirror driving means to be used for adjustment of attitude of the first mirror 105, and denoted at 112 is a second mirror driving means to be used for adjustment of attitude of the second mirror 106. Mirror unit 113, including these components, is mounted on a mirror table 114.

Denoted at 115 is a shutter unit for controlling the amount of exposure. It comprises shutter shafts 117 and 118 mounted on a shutter holding table 141, and shutter films 119 and 120 stretched between the shafts 117—117 and between the shafts 118—118, respectively. Each of the shutter films 119 and 120 is provided by an endless steel (SUS) belt member with an opening (shutter aperture) 121 or 122 of oblong shape having sides longer than the size of the exposure region.

Mounted on a beam-line and auto-alignment fixing table 145 is an auto-alignment frame 143 on which the shutter unit 115 and an auto-alignment unit 139 are mounted. It is arranged to provide a chamber structure by which the shutter unit 115, the auto-alignment unit 139, a mask 123 on a mask chuck 125, and a wafer 126 on a wafer six-axis stage 142 can be surrounded by a desired helium ambience. It is communicated with an aligner major assembly 109 through a bellows (A) 144, flexibly connecting it to the aligner major assembly 109. Of course, it is so arranged that, even if the chamber inside is held at a reduced pressure, the bellows (A) 144 between the aligner major assembly 109 and the auto-alignment frame 143 is not contracted.

Denoted at 134 and 135 are piping spools for communicating the mirror chamber 110 with the auto-alignment frame 143 as well as the aligner major assembly 109 while keeping their ambiences. Denoted at 137 is a beryllium window for transmitting the illumination light 108 and for insulating vacuum ambience within the mirror chamber 110 and helium ambiences within the auto-alignment frame 143 and the aligner major assembly 109, from each other. It is supported by the beam-line and auto-alignment fixing table 164.

Denoted at 109 is the aligner major assembly. Denoted at 139 is an auto-alignment unit (AA unit) mounted through an auto-alignment fixing member 57 on an auto-alignment tilt stage 147 which is movable in rotational directions (wx and wy) about two axes perpendicular to the exposure optical axis, and also on an auto-alignment stage 156 which is movable in two axis directions (X and Y) perpendicular to the exposure optical axis and is movable in a rotational direction (wz) around the X-ray optical axis. The auto-alignment unit 139 serves to measure a positional deviation of the mask 123 with respect to the auto-alignment unit 139 and a positional deviation of the wafer 126 with respect to the mask, at high precision.

Denoted at 123 is the mask on which a transfer pattern is formed by an X-ray non-transmissive material such as gold, for example. Denoted at 125 is a mask chuck for holding the mask 123. The mask chuck is supported by the auto-alignment fixing member 157, whereby it is held integrally with the auto-alignment unit 139.

Denoted at 126 is a wafer onto which an image of the mask 123 is to be transferred. Denoted at 128 is a wafer chuck for fixedly holding the wafer 126 on a wafer six-axis stage 142. The wafer stage 142 is movable while carrying the wafer 126 thereon. Laser interferometer means 165 serves as position detecting means for the wafer six-axis stage 142, and it functions to measure position in the X, Y, wx, wy and wz directions. It is fixedly mounted on an interferometer fixing member 158 which comprises an elongation of the auto-alignment fixing member 157.

Interferometer mirror 167 having a surface to be measured by the laser interferometer 165 is fixed to the wafer six-axis stage 142. Laser head 159, which projects a laser beam, is supported by the auto-alignment frame 143, and it is connected to the laser interferometer 165 via an optical fiber cable 160 and through a communication portion of a bellows (C) 166, flexibly connected to the aligner major assembly 109 in a similar manner as the bellows (A) 144. Since the laser interferometer 165 and the laser head 159 are disposed with the structure described above, they are integrally held fixed with the auto-alignment unit 139 and the mask 123. Here, the integral fixation of the laser interferometer 165, the auto-alignment unit 139 and the mask 123 may be provided desirably by mechanical fixation using screw fixation, for example. However, as another example, the laser interferometer 148 may be provided with a laser interferometer stage (not shown) of a separate supporting system, of a similar structure as that of the auto-alignment stage 156 or auto-alignment tilt stage 147, and this laser interferometer stage may be controlled so that the relative positional relation with the auto-alignment unit 139 is unchanged. Thus, on that occasion, the auto-alignment unit 139 and the laser interferometer 165 move apparently integrally (in synchronism). In this case, however, the control system may be somewhat complicated.

Denoted at 146a and 146b are SR optical axis monitors for monitoring a deviation of the exposure optical axis of the illumination light 108. The SR optical axis monitors serve to monitor the position of the SR light, at least at two separate points on the exposure optical axis, to thereby detect the position and the angle of the SR optical axis. For monitoring the position of the SR light at respective points, as an example, two or more SR light intensity sensors may be disposed to sandwich the SR light therebetween, and outputs of these sensors may be compared with each other. Using two SR light intensity sensors enables detection of the position of SR light in terms of one-dimensional information. Using three or more SR light intensity sensors enables complete detection of the position of the SR light in terms of two-dimensional information.

Denoted at 146a is one sensor group in an example when the SR optical axis is monitored at two points. It is fixed to the auto-alignment unit 139. The other sensor group 146b is fixed to the mirror chamber 110, so as to sandwich the optical axis just after diversion by the first mirror 106. By measuring the intensity profile by means of these two sensor groups, any deviation of the SR optical axis from a predetermined position (in the X, Y and tilt directions) can be monitored.

Denoted at 129 is an aligner frame on which the mask stage 124 and the wafer six-axis stage 142, for example, are mounted. It is communicated with the auto-alignment frame 143 to provide a chamber structure by which a desired ambience is retained.

Denoted at 130 is an aligner base on which the aligner frame 129 is mounted. The aligner base 130 is supported at three locations by means of at least three air springs 131.

In operation for exposure of the wafer 126 with the structure described above, for every shot, the wafer six-axis stage 142 is moved stepwise. By means of the auto-alignment unit 139 and the wafer stage 142, the mask 123 and the wafer 126 are brought into alignment with each other. Plural mask patterns are transferred onto the wafer 126. The SR light source unit 100, the mirror unit 113 and the aligner major assembly 109 are all formed into separate supporting systems, as described. With regard to relative positional variation among them, that is, with regard to a deviation between the aligner major assembly and the optical axis of the X-rays coming from the SR light source unit 100 via the mirror unit 113, the following solution is provided.

First, as regards the attitude change of the aligner major assembly (particularly, one due to stage movement), since the laser interferometer 165, which is the position detecting means for the wafer six-axis stage 142, is structured with a supporting system separate from the aligner major assembly 109, the attitude variation component appears as a positional deviation of the stage.

Usually, however, the stage positioning is based on the positioning feedback control with the laser interferometer 165 (position detecting means), the positional deviation component due to the attitude change is corrected by the wafer six-axis stage at a desired timing.

Therefore, even if attitude change occurs in the aligner major assembly, it does not affect the positional relationship between the X-ray optical axis and the auto-alignment optical axis. Also, substantially no influence is applied to the positional relation between the wafer and them.

Then, when attitude variation occurs in the SR light source unit 100 or at the X-ray optical axis (illumination light 108) side of the mirror unit 113, for example, relative to the aligner major assembly 109 (i.e., a shift of the optical axis of illumination light 108), the amount of deviation of the SR optical axis is detected by means of the SR optical axis monitor 146b having one component mounted in relation to the mirror unit 113 as well as the SR optical axis monitor 146a having one component mounted in relation to the auto-alignment unit 139. On the basis of the detected deviation amount, the auto-alignment stage 156 and the auto-alignment tilt stage 147 are driven, so that it is brought into alignment with the shifted X-ray optical axis side (illumination light 108).

Since the auto-alignment unit 139, the mask 123 and the laser interferometer 165 are held integrally, the above-described correction operation causes a change in positional relation between the laser interferometer 165 and the wafer six-axis stage 142. However, since the stage positioning operation is based on the positioning feedback control through the laser interferometer 165, the wafer six-axis stage 142 can follow the movement of the auto-alignment unit 139.

Further, as a result of bringing the auto-alignment unit 139 into alignment with the shifted X-ray optical axis (illumination light 108), the relation between the shutter unit 115 and the exposure position (exposure shot position of the wafer 126, the mask 123 and the auto-alignment unit 139) is maintained. However, by displacing the aperture drive origins for the shutter apertures 121 and 122 for exposure amount correction, in accordance with displacement of the exposure position and by a corresponding amount (Y direction), uniform exposure amount correction is attainable regardless of the change in exposure position.

Here, as regards a deviation of the X-ray optical axis the around the optical axis, description is omitted. If necessary, the auto-alignment stage 156 may be equipped with freedom (wz) around the optical axis and the shutter unit 115 may be equipped with freedom (wz) around the optical axis. Similar to the other axes, they may be adjusted into alignment with the deviation of the X-ray optical axis. Any way, even if an attitude change occurs at the X-ray optical axis side (illumination light 108), it does not affect the positional interrelation among the X-ray optical axis, the auto-alignment optical axis and the wafer.

Figure 7:
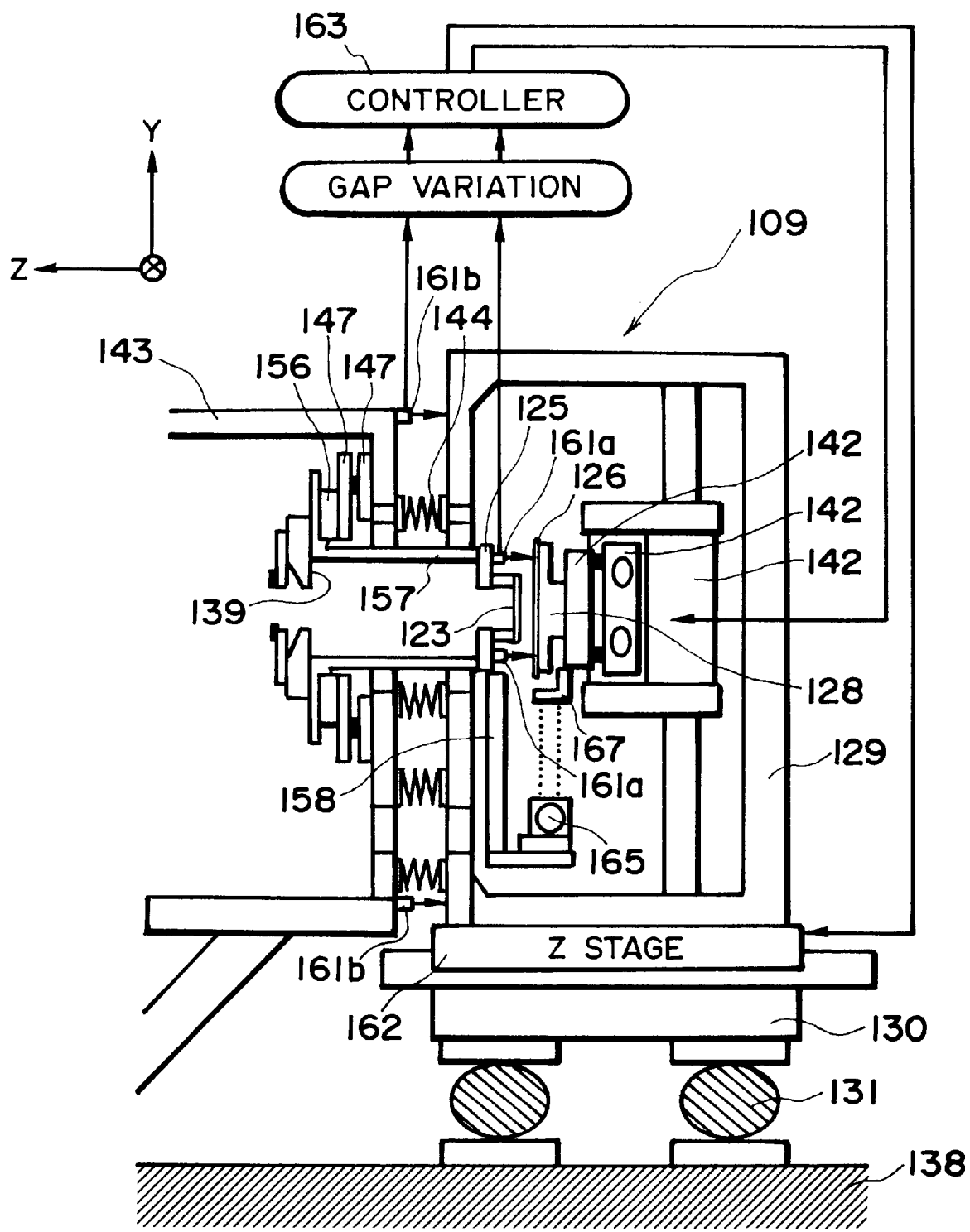
FIG. 7 is an enlarged view for explaining a portion of the X-ray aligner of FIG. 5, in detail.

Since, in this embodiment, the supporting systems for the mask 123 and the wafer 126 are separate, it is necessary to maintain the interval (Z direction) between them constant. FIG. 7 illustrates measuring means for measuring the interval of them (Z direction).

With regard to FIG. 7, a description of those components similar to those of FIG. 5 will be omitted.

Denoted at 161a is a gap sensor (A) which is fixedly mounted on the mask chuck 125 and which serves to perform non-contact measurement of the gap between the mask 123 and the wafer 126. In order that the tilt component is taken into account, a plurality of sensors (three, for example) are provided with a certain spacing.

Denoted in FIG. 7 at 161b is another interval measuring means for the mask and the wafer. It comprises a gap sensor (B) which is fixedly mounted on the auto-alignment frame 143 and which serves to perform non-contact measurement of the gap between the auto-alignment frame 143 and the aligner frame 129. In order that the tilt component is taken into account, a plurality of sensors (three, for example) are provided with a certain spacing.

While two sensor means are used in the example of FIG. 7, these gap sensors 161a and 161b are of course an example of interval measuring means. Only one of them may be used.

Denoted at 162 is an aligner Z stage for moving the aligner frame 129 in the Z direction.

With the structure described above, the gap sensor (A) 161a or the gap sensor (B) 161b continuously monitors the interval in the Z direction between the wafer 126 and the mask 123 or the interval in the Z direction between the auto-alignment frame 143 and the aligner frame 129. If there occurs a change in the Z-direction interval due to the X-Y step motion of the wafer six-axis stage 142, for example, the variation component is fed back to the Z stage of the wafer six-axis stage 142 through the controller 163. By this, the interval of them in the Z direction can be held constant. For the feedback drive, in addition to the wafer six-axis stage 142, the aligner Z stage 162 provided in the FIG. 3 example may be used.

Figure 6:
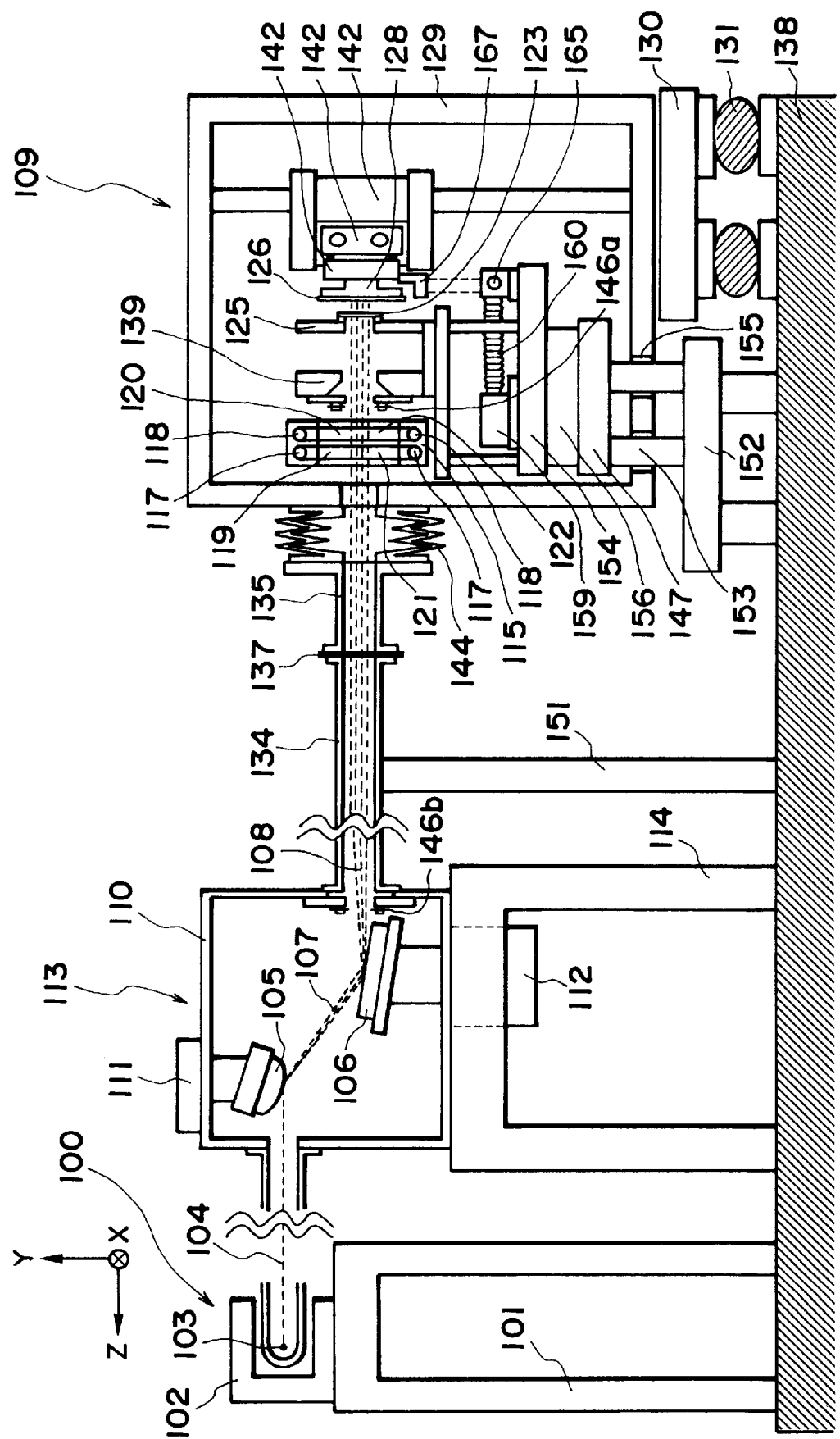
FIG. 6 is a schematic view of an X-ray aligner according to a further embodiment of the present invention.

FIG. 6 shows an aligner according to a still further embodiment of the present invention. In FIG. 6, a description of those components such as the SR light source unit 100 or mirror unit 113 similar to those of FIG. 5 will be omitted.

Denoted at 151 is a beam-line fixing table which supports piping spools 134 and 135 for connecting the mirror chamber 110 and the aligner major assembly 109 while keeping their ambiences.

Denoted at 152 is an auto-alignment table for supporting the auto-alignment unit 139 and the shutter unit 115, for example, outside the aligner frame 129. It serves to support the shutter unit 115 and the auto-alignment unit 139, for example, accommodated in the aligner frame 129, through a supporting rod 153. The supporting rod 153 is out of contact with the auto-alignment table 152 and a magnetic fluid seal 155 is used to seal the clearance between the supporting rod 153 and the inlet opening, so as to assure that the ambience within the aligner frame 129 is retained and that vibration of the aligner frame 129 is not transmitted to the auto-alignment table 152.

The auto-alignment unit 139, the shutter unit 115, the mask 123, the mask chuck 125, the laser interferometer 165 (position detecting means for the wafer six-axis stage 142), the laser head 159, and the optical fiber cable 160 are all held fixedly and integrally on the auto-alignment stage base 154. Also, the auto-alignment stage base 154 is fixedly mounted on the auto-alignment tilt stage 147 which is disposed on the supporting rod 153 and is movable in rotational directions (wx and wy) about two axes perpendicular to the exposure optical axis, as well as on the auto-alignment stage 156 which is movable along two axes (X and Y) perpendicular to the exposure optical axis and in a rotational direction (wz) around the X-ray optical axis.

The aligner frame 129 comprises a frame member on which the wafer six-axis stage 142 is mounted. Also, it is formed into a chamber structure by which, in addition to the wafer six-axis stage 142, the units on the supporting rod 153 can be held in a desired ambience.

With the structure described above, like the embodiment of FIG. 5, the following solution is provided to relative deviation between the X-ray optical axis from the SR light source unit 100 via the mirror unit 113 and the reference attitude of the aligner major assembly 109.

First, as regards the attitude change of the aligner major assembly (particularly, one due to stage movement), like the embodiment of FIG. 5, since the laser interferometer 165, which is the position detecting means for the wafer six-axis stage 142, is structured with a separate supporting system from the aligner major assembly, the attitude change component can be corrected (controlled), as a stage positional deviation, by means of the wafer six-axis stage 142 at a desired timing.

Then, when an attitude deviation occurs in the SR light source unit or at the X-ray optical axis side of the mirror unit 113 (displacement of the optical axis of illumination light 108), relative to the aligner major assembly, like the embodiment of FIG. 5, a deviation of the SR optical axis is detected by means of the SR optical axis monitors 146a and 146b. Then, on the basis of the detected deviation, the auto-alignment stage 156 and the auto-alignment tilt stage 147 are driven so that the auto-alignment unit 139 is adjusted with respect to the shifted X-ray optical axis (illumination light 108).

Since, in this embodiment, the shutter unit 115 is fixed integrally with the auto-alignment unit 139, the shutter unit 115 is continuously brought into alignment with the X-ray optical axis (illumination light 108) and the exposure position (exposure shot position of the wafer 126, the mask 123 and the auto-alignment unit 139). Therefore, in this embodiment, the relation between the shutter unit 115 and the above exposure position is unchanged. Thus, in this embodiment, displacing the aperture drive origin of the shutter apertures 121 and 122 as in the preceding embodiment can be omitted. Also the control system can be more simple.

In accordance with these embodiments of the present invention, the SR light source unit 100, the mirror unit 113 and the aligner major assembly 109 are all structured with separate supporting systems, and even if a relative positional variation among them deviates between the X-ray optical axis side (illumination light 108) and the aligner major assembly 109, there does not occur run-out error or increased exposure non-uniformness. Further, the effect on the throughput (chip cost) is very small, and an X-ray exposure apparatus of lower cost is assured.

Next, an embodiment of a device manufacturing method which uses an exposure apparatus or exposure method such as described above, will be explained.

Figure 8:
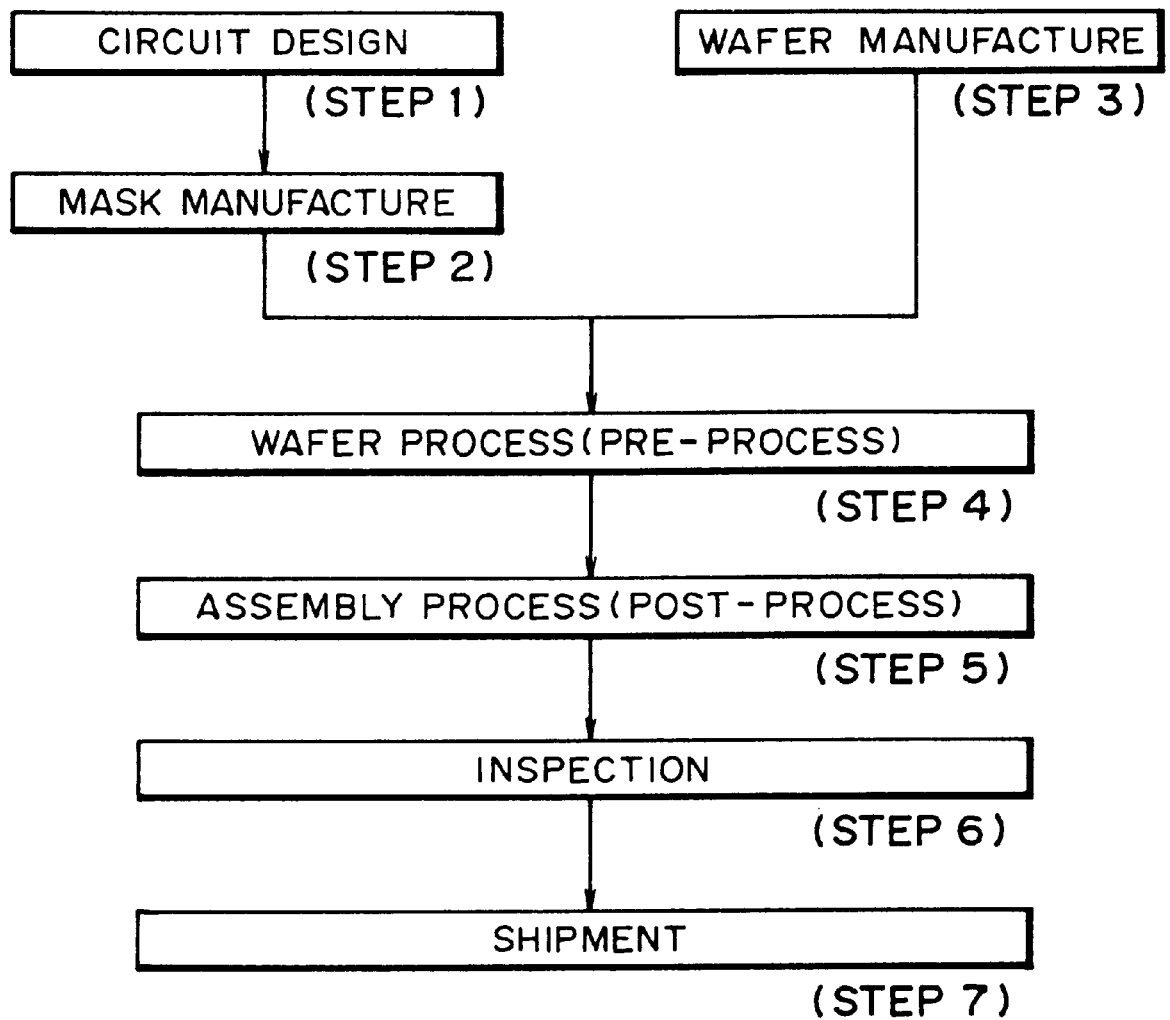
FIG. 8 is a flow chart for explaining semiconductor device manufacturing processes.

FIG. 8 is a flow chart of a procedure for manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes a assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 9:
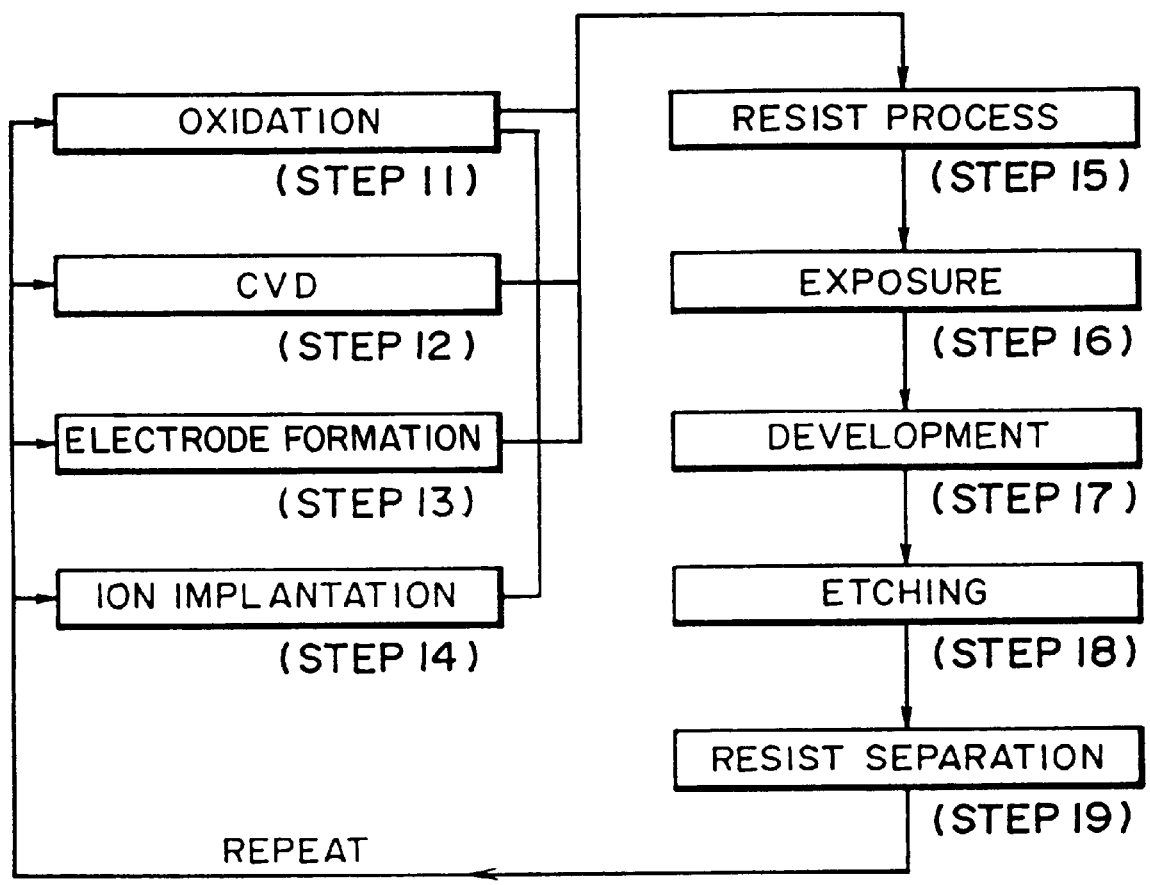
FIG. 9 is a flow chart for explaining a wafer process in detail.
Figure 10:
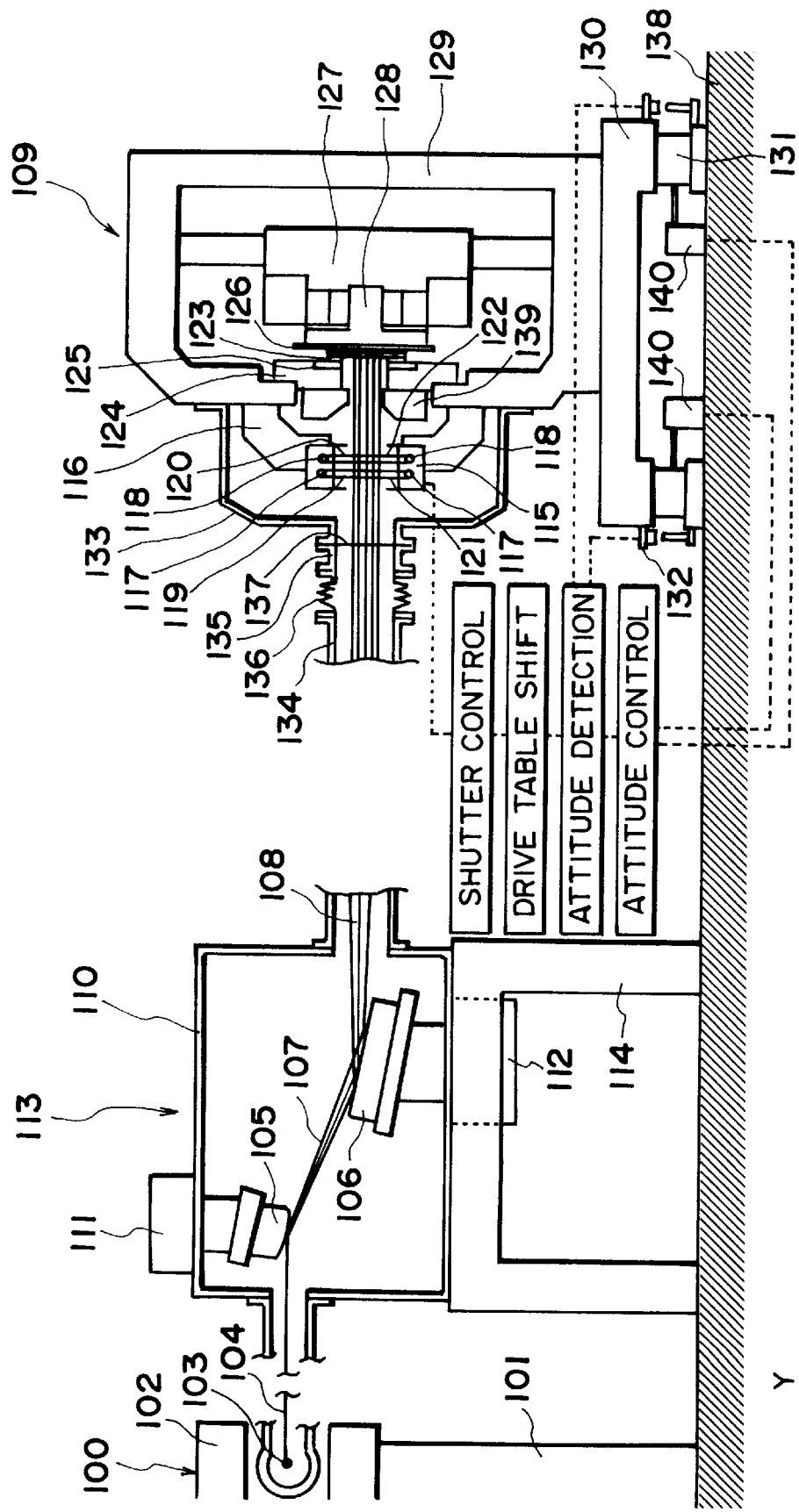
FIG. 10 is a schematic view of a known type X-ray aligner.

FIG. 9 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a wafer to a mask with radiation light to thereby transfer a pattern of the mask onto the wafer, said apparatus comprising:

a light source for emitting the radiation light;

a major assembly having a wafer stage for holding the wafer and being supported by a supporting system separate from said light source;

a mask stage for positioning the mask;

a mask chuck, fixed on said mask stage, for holding the mask;

an alignment unit, mounted on a movable stage, for performing alignment measurement for the wafer and the mask, the movable stage being supported by a supporting system separate from said major assembly; and correcting means for controlling the movable stage to correct attitude of said alignment unit with respect to an optical axis of the radiation light and for moving said mask stage and said wafer stage in accordance with an amount of corrective drive provided by said alignment unit.

2. An apparatus according to claim 1, wherein said correcting means comprises monitoring means disposed on or adjacent to said alignment unit for monitoring an optical axis deviation of the radiation light, with the movable stage being controlled on the basis of the monitoring by said monitoring means.

3. An apparatus according to claim 1, wherein said correcting means comprises an alignment stage having one of a freedom in two orthogonal directions along a plane perpendicular to an exposure optical axis, and a freedom in directions around these two axes, respectively.

4. An apparatus according to claim 3, wherein said correcting means comprises a control system for feeding information related to the optical axis deviation measured by said monitoring means back to said alignment stage and said wafer stage.

5. An apparatus according to claim 1, wherein said light source comprises a synchrotron emitter for emitting the radiation light, which comprises X-rays.

6. An exposure apparatus for exposing a wafer to a mask with radiation light to thereby transfer a pattern of the mask onto the wafer, said apparatus comprising:

a light source for emitting the radiation light;

a major assembly having a wafer stage for holding the wafer and being supported by a supporting system separate from said light source;

a mask stage for positioning the mask:

a mask chuck, fixed on said mask stage, for holding the mask;

an alignment unit, mounted on a movable stage, for performing alignment measurement for the wafer and the mask;

correcting means for controlling the movable stage to correct attitude of said alignment unit with respect to an optical axis of the radiation light; and a laser interferometer for measuring a position of the wafer stage such that positioning of the wafer stage is based on positioning feedback control through said laser interferometer, wherein said alignment unit, said laser interferometer and said mask chuck are supported by a supporting system separate from said major assembly.

7. An apparatus according to claim 6, wherein said laser interferometer is held fixedly and integrally with said mask chuck, so that the mask provides a reference for measurement.

8. An apparatus according to claim 6, wherein said light source comprises a synchrotron emitter for emitting the radiation light, which comprises X-rays.

9. A device manufacturing method including a step using an exposure apparatus as recited in any one of claims 1–8.

* * * * *

UNITED STATES PATENT AND TRADEMARK OFFICE
CERTIFICATE OF CORRECTION

PATENT NO. : 5,930,324

DATED : July 27, 1999

INVENTOR(S): SHIN MATSUI, ET AL.

It is certified that error appears in the above-identified patent and that said Letters Patent is hereby corrected as shown below:

IN THE DRAWINGS:

FIGURE 4,
AXS" should read --AXIS--.

IN THE DISCLOSURE:

COLUMN 13,
Line 45, "SR" should read --the SR--.

COLUMN 14,
Line 65, "the" (2nd occurrence) should be deleted; and
Line 66, "description" should read --the description--.

Signed and Sealed this

Second Day of May, 2000

Attest:

Q. TODD DICKINSON

*Attesting Officer*        *Director of Patents and Trademarks*